US012719364B2

(12) United States Patent
Park et al.

(10) Patent No.: US 12,719,364 B2
(45) Date of Patent: Aug. 25, 2026

(54) TECHNIQUES FOR OPERATING A SWITCHED-MODE POWER SUPPLY

(71) Applicant: QUALCOMM Incorporated, San Diego, CA (US)

(72) Inventors: Sunghyun Park, Campbell, CA (US); Pavan Kumar Ramakrishna, San Jose, CA (US); Roger Brockenbrough, Los Gatos, CA (US)

(73) Assignee: Qualcomm Incorporated, San Diego, CA (US)

( * ) Notice: Subject to any disclaimer, the term of this patent is extended or adjusted under 35 U.S.C. 154(b) by 395 days.

(21) Appl. No.: 18/446,332

(22) Filed: Aug. 8, 2023

(65) Prior Publication Data

US 2024/0055991 A1 Feb. 15, 2024

Related U.S. Application Data

(60) Provisional application No. 63/491,680, filed on Mar. 22, 2023, provisional application No. 63/370,878, filed on Aug. 9, 2022.

(51) Int. Cl.

*H02M 3/156* (2006.01)
*H02J 7/34* (2006.01)
*H02M 1/00* (2006.01)
*H02M 1/36* (2007.01)
*H02M 3/157* (2006.01)
(Continued)

(52) U.S. Cl.

CPC ........... *H02M 3/1566* (2021.05); *H02J 7/345* (2013.01); *H02M 1/0032* (2021.05); *H02M 1/0035* (2021.05); *H02M 1/36* (2013.01); *H02M 3/156* (2013.01); *H02M 3/157* (2013.01);

(Continued)

(58) Field of Classification Search

CPC .... H02M 1/0032; H02M 1/0035; H02M 1/36; H02M 3/156; H02M 3/1566; H02M 3/157; H02M 3/158; H02J 7/345; H03K 7/06; H03K 7/08

See application file for complete search history.

(56) References Cited

U.S. PATENT DOCUMENTS 10,742,242 B1 8/2020 Daigle et al.
2011/0006744 A1 1/2011 Dearborn (Continued)

FOREIGN PATENT DOCUMENTS

EP 3211751 A1 8/2017

OTHER PUBLICATIONS

International Search Report and Written Opinion—PCT/US2023/071911—ISA/EPO—Nov. 14, 2023.

*Primary Examiner* — Patrick O Neill
(74) *Attorney, Agent, or Firm* — Gerald P. Joyce, III

(57) ABSTRACT

Techniques and apparatus for transitioning between various operating modes for a switched-mode power supply (SMPS) in a wireless local area network (WLAN) device powered by a coin cell battery in an effort to maintain performance and functionality of the WLAN device and efficiency of the SMPS. One example apparatus is an integrated circuit (IC) for power management. The IC generally includes: a first port for coupling to a battery and a first terminal of a capacitive element; a second port for coupling to a second terminal of the capacitive element; a SMPS having an input coupled to the first port; and a switch coupled between the second port and a reference potential node for the IC.

11 Claims, 8 Drawing Sheets

(51) Int. Cl.
*H02M 3/158* (2006.01)
*H03K 7/06* (2006.01)
*H03K 7/08* (2006.01)

(52) U.S. Cl.
CPC .............. *H02M 3/158* (2013.01); *H03K 7/06* (2013.01); *H03K 7/08* (2013.01)

(56) References Cited

U.S. PATENT DOCUMENTS

2017/0310141 A1 10/2017 Fall et al.
2020/0127566 A1* 4/2020 Lazaro ................ H02M 1/0061
2021/0067033 A1* 3/2021 Jing ...................... H02M 3/158
2023/0006555 A1* 1/2023 Jung ..................... H02M 3/158

* cited by examiner

TECHNIQUES FOR OPERATING A SWITCHED-MODE POWER SUPPLY

CROSS-REFERENCE TO RELATED APPLICATIONS

The present application for patent claims the benefit of priority to U.S. Provisional Patent Appl. No. 63/491,680, filed Mar. 22, 2023, and to U.S. Provisional Patent Appl. No. 63/370,878, filed Aug. 9, 2022, both of which are hereby incorporated by reference herein in their entireties.

TECHNICAL FIELD

Certain aspects of the present disclosure generally relate to electronic circuits and, more particularly, to a switched-mode power supply.

BACKGROUND

A voltage regulator provides a constant direct current (DC) output voltage regardless of changes in load current or input voltage. Voltage regulators may be classified as either linear regulators or switching regulators. While linear regulators tend to be small and compact, many applications may benefit from the increased efficiency of a switching regulator. A linear regulator may be implemented by a low-dropout (LDO) regulator, for example. A switching regulator may be implemented by a switched-mode power supply (SMPS), such as a buck converter, a boost converter, a buck-boost converter, or a charge pump.

For example, a buck converter is a type of SMPS typically comprising: (1) a high-side switch coupled between a relatively higher voltage rail and a switching node, (2) a low-side switch coupled between the switching node and a relatively lower voltage rail, (3) and an inductor coupled between the switching node and a load (e.g., represented by a shunt capacitive element). The high-side and low-side switches may be implemented with transistors, although the low-side switch may alternatively be implemented with a diode.

Power management units (PMUs) are used for managing the power requirement of a host system and may include and/or control one or more voltage regulators (e.g., LDOs and/or SMPSs). A PMU may be used in battery-operated devices, such as mobile phones, tablets, laptops, wearables, etc., to control the flow and direction of electrical power in the devices. The PMU may perform a variety of functions for the device such as DC-to-DC conversion (e.g., using a voltage regulator as described above), battery charging, power-source selection, voltage scaling, power sequencing, etc.

SUMMARY

The systems, methods, and devices of the disclosure each have several aspects, no single one of which is solely responsible for its desirable attributes. Without limiting the scope of this disclosure as expressed by the claims that follow, some features will now be discussed briefly. After considering this discussion, and particularly after reading the section entitled "Detailed Description," one will understand how the features of this disclosure provide the advantages described herein.

Certain aspects of the present disclosure generally relate to a wireless local area network (WLAN) device comprising a switched-mode power supply and a coin cell battery coupled to and configured to power the switched-mode power supply.

Certain aspects of the present disclosure generally relate to techniques for transitioning quickly between various operating modes for a switched-mode power supply in a WLAN device powered by a coin cell battery in an effort to maintain performance, functionality, and efficiency.

Certain aspects of the present disclosure provide an integrated circuit (IC) for power management. The IC generally includes: a first port for coupling to a battery and a first terminal of a capacitive element; a second port for coupling to a second terminal of the capacitive element; a switched-mode power supply (SMPS) having an input coupled to the first port; and a switch coupled between the second port and a reference potential node for the IC.

Certain aspects of the present disclosure provide a WLAN device comprising the IC described herein. The WLAN device further includes: the battery having a first terminal coupled to the first port and having a second terminal coupled to the reference potential node for the IC; and the capacitive element coupled between the first port and the second port of the IC.

Certain aspects of the present disclosure provide a circuit for controlling an output stage of a SMPS. The circuit generally includes: a comparator having a first input coupled to a reference voltage node and having a second input coupled to an output of the SMPS; and logic having an input coupled to an output of the comparator and having an output coupled to a control input of the SMPS, wherein the logic is configured to generate a first pulse to temporarily enable the output stage of the SMPS based on a regulated voltage at the second input of the comparator being lower than a reference voltage at the first input of the comparator, the first pulse being further generated based on a clock signal.

Certain aspects of the present disclosure provide a method for controlling an output stage of a SMPS. The method generally includes: comparing, via a comparator, a reference voltage and a regulated voltage at an output of the SMPS; and generating, via logic coupled to an output of the comparator, a first pulse to temporarily enable the output stage of the SMPS based on the regulated voltage being lower than the reference voltage, the first pulse being further generated based on a clock signal.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Figure 1:
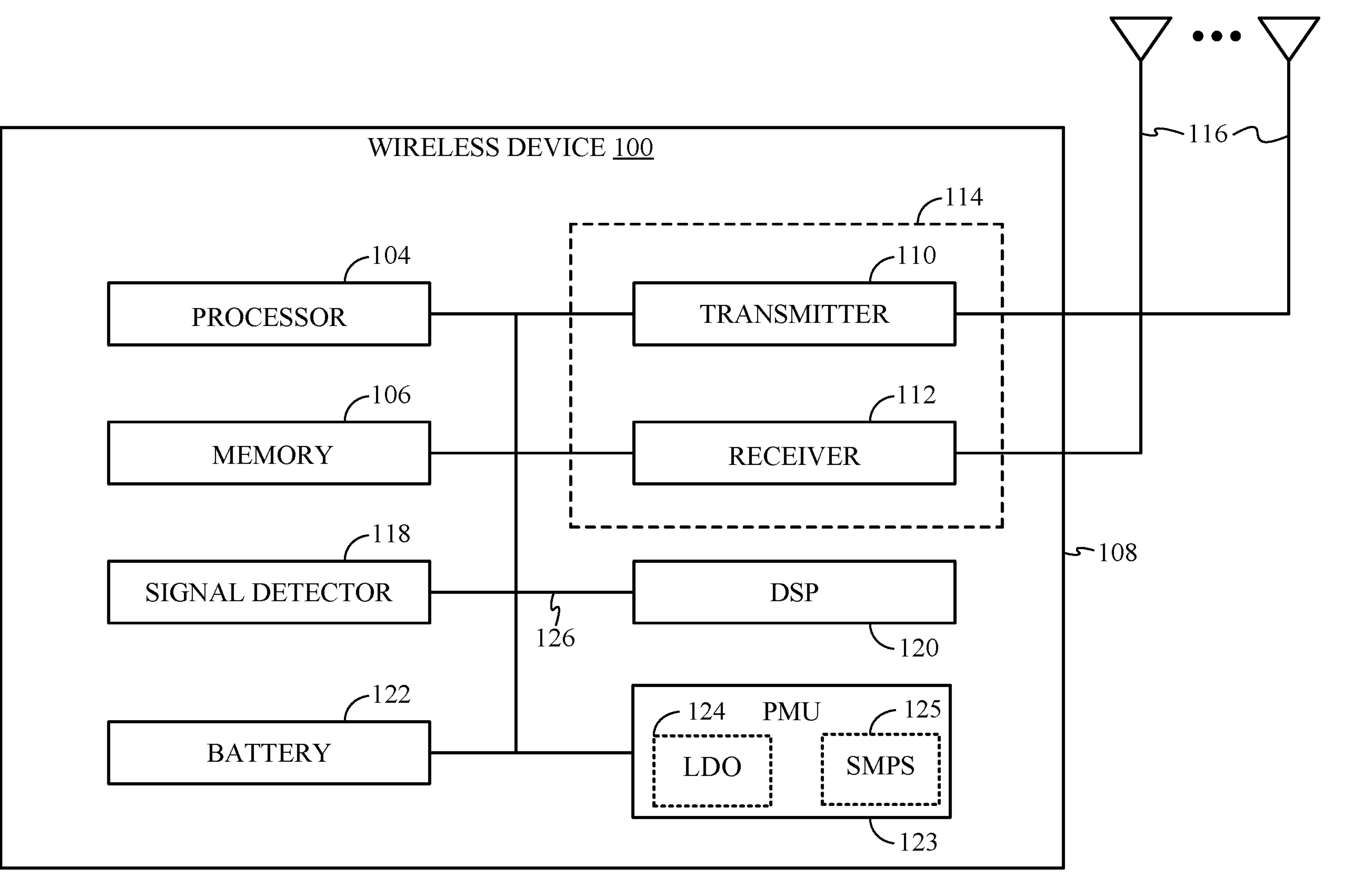
FIG. 1 is a block diagram of an example device that includes a battery coupled to a power management unit (PMU), in accordance with certain aspects of the present disclosure.

Certain aspects of the present disclosure are directed toward apparatus and techniques for operating a switched-mode power supply (SMPS). In some implementations, the SMPS may be powered by a coin cell battery, which may have a high impedance. In some aspects, when the SMPS consumes little power from the coin cell battery (e.g., in a receive mode), power from the battery may be stored in a capacitive element. When the SMPS is later consuming more power from the coin cell battery (e.g., in transmit mode), the power for the SMPS may be provided from both the coin cell battery and the capacitive element. Thus, the total current consumed for the transmit mode is taken from the battery during a longer time window, reducing the impact of the high impedance associated with the coin cell battery on the operation of the SMPS.

Some aspects of the present disclosure are directed to a controller configured to operate the SMPS in a low power mode. For example, in the low power mode, the controller may compare an output voltage (Vout) of the SMPS to a reference voltage (Vref), and based on which, generate a pulse (also referred to herein as a "one-shot pulse" or "activation pulse") that temporarily enables an output stage of the SMPS. In some cases, the controller may monitor a duration of a tristate phase of the SMPS. The tristate phase duration may be indicative of a load current of the SMPS. Based on the tristate phase duration dropping below a threshold (e.g., indicating increased load current), the controller may increase a duration of the activation pulse used to temporarily enable the SMPS, increasing inductor current to supply the increased load.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Device

It should be understood that aspects of the present disclosure may be used in a variety of applications. Although the present disclosure is not limited in this respect, the circuits disclosed herein may be used in any of various suitable apparatus, such as in the power supply, battery charging circuit, or power management circuit of a communication system, a video codec, audio equipment such as music players and microphones, a television, camera equipment, and/or test equipment such as an oscilloscope. Communication systems intended to be included within the scope of the present disclosure include, by way of example only, cellular radiotelephone communication systems, satellite communication systems, two-way radio communication systems, one-way pagers, two-way pagers, personal communication systems (PCS s), personal digital assistants (PDAs), Internet of Things (IoT) devices, and the like.

FIG. 1 illustrates an example device 100 in which aspects of the present disclosure may be implemented. The device 100 may be a battery-operated device such as a cellular phone, a PDA, a handheld device, a wireless device, a laptop computer, a tablet, a smartphone, a wearable device, an augmented reality device, etc.

The device 100 may include a processor 104 that controls operation of the device 100. The processor 104 may also be referred to as a central processing unit (CPU). Memory 106, which may include both read-only memory (ROM) and random access memory (RAM), provides instructions and data to the processor 104. A portion of the memory 106 may also include non-volatile random access memory (NVRAM). The processor 104 typically performs logical and arithmetic operations based on program instructions stored within the memory 106.

In certain aspects, the device 100 may also include a housing 108 that may include a transmitter 110 and a receiver 112 to allow transmission and reception of data between the device 100 and a remote location. For certain aspects, the transmitter 110 and receiver 112 may be combined into a transceiver 114. One or more antennas 116 may be attached or otherwise mechanically coupled to the housing 108 and electrically coupled to the transceiver 114. The device 100 may also include (not shown) multiple transmitters, multiple receivers, and/or multiple transceivers.

The device 100 may also include a signal detector 118 that may be used in an effort to detect and quantify the level of signals received by the transceiver 114. The signal detector 118 may detect such signal parameters as total energy, energy per subcarrier per symbol, and power spectral density, among others. The device 100 may also include a digital signal processor (DSP) 120 for use in processing signals.

The device 100 may further include a battery 122 used to power the various components of the device 100. For certain aspects, the battery 122 may be a coin cell battery, such as a CR2032 battery, which is a round lithium battery and may be capable of delivering 220 milliampere hours (mAh).

The device 100 may also include a power management unit (PMU) 123 for managing the power from the battery to the various components of the device 100. At least a portion of the PMU 123 may be implemented in one or more power management integrated circuits (power management ICs or PMICs). The PMU 123 may perform a variety of functions for the device 100 such as DC-to-DC conversion, battery charging, power-source selection, voltage scaling, power sequencing, etc. For example, the PMU 123 may include a battery charging circuit (e.g., a master-slave battery charging circuit) for charging the battery 122. The PMU 123 may include one or more power supply circuits, which may include at least one low-dropout (LDO) voltage regulator 124 and/or at least one switched-mode power supply (SMPS) 125. The switched-mode power supply may be implemented by any of various suitable switched-mode power supply circuit topologies, such as a buck converter, a boost converter, a buck-boost converter, or a charge pump. In some aspects, the SMPS may be operated in a low power mode, as described in more detail herein.

The various components of the device 100 may be coupled together by a bus system 126, which may include a power bus, a control signal bus, and/or a status signal bus in addition to a data bus. Additionally or alternatively, various combinations of the components of the device 100 may be coupled together by one or more other suitable techniques.

Example Switched-Mode Power Supply (SMPS)

Micro-power Wi-Fi technology (e.g., under the IEEE 802.11 family of standards, such as IEEE 802.11n) enables Wi-Fi devices to run under coin cell batteries (e.g., CR2032 batteries) and achieve usable battery life. For certain aspects, such micro-power Wi-Fi technology may be used for extended personal area network (XPAN) applications.

Figure 2:
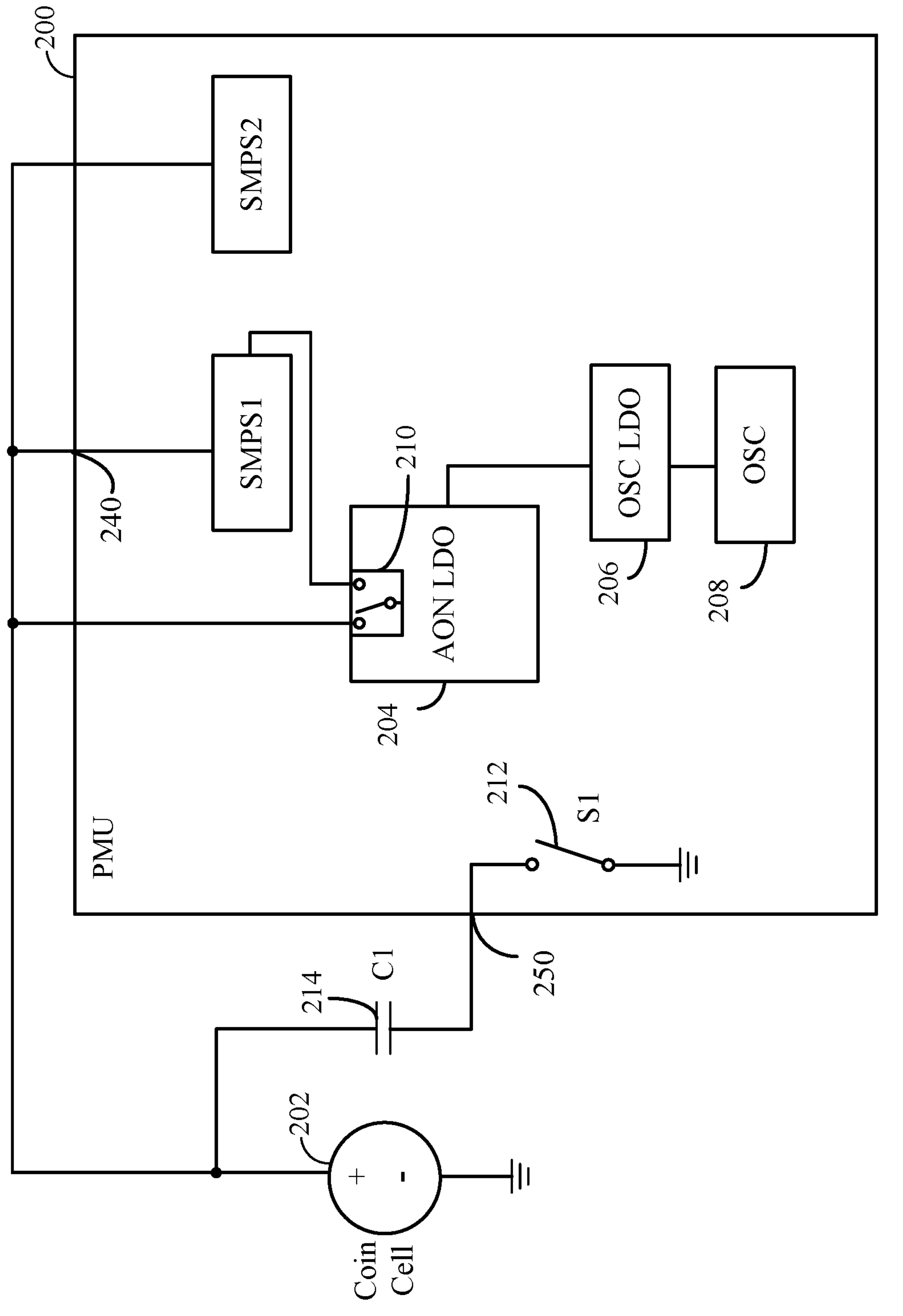
FIG. 2 is a block diagram of an example PMU powered by a coin cell battery, in accordance with certain aspects of the present disclosure.

FIG. 2 is a block diagram of an example power management unit (PMU) 200 powered by a coin cell battery 202, in accordance with certain aspects of the present disclosure. The PMU 200 may include at least one switched-mode power supply (SMPS). For example, the PMU 200 may include two switched-mode power supplies, as shown, labeled “SMPS1” and “SMPS2.” The SMPS may generate a regulated voltage (Vreg, also referred to herein as an output voltage (Vout)) based on power from the coin cell battery 202. The PMU 200 may also include an always-on low-dropout regulator 204 (labeled “AON LDO”), an oscillator low-dropout regulator 206 (labeled “OSC LDO”), and an oscillator 208 (labeled “OSC”). As shown, using a switch 210, the AON LDO 204 may be operated based on the voltage at a terminal of the coin cell battery 202 or a regulated voltage generated by SMPS1. The always-on low-dropout regulator 204 may generate a regulated voltage for an always-on domain and some memory structures of a system-on-chip (SOC). The oscillator 208 may be used as a sleep mode clock source, powered by a regulated voltage generated by the oscillator low-dropout regulator 206.

In the case of micro-power Wi-Fi, a wireless local area network (WLAN) integrated circuit (IC) may be powered by a single coin cell battery. In this case, switching regulators (e.g., internal to the PMU 200) may provide programmable regulated voltages for an analog portion (e.g., a radio frequency (RF) transmitter and/or receiver) and a digital portion (e.g., the system on a chip (SOC)) that are part of the WLAN IC. For example, SMPS1 and SMPS2 may serve as regulators for radio frequency (RF) front-end (RFFE) circuitry and system-on-chip (SOC), respectively. The switching regulators (e.g., SMPS1 and SMPS2) may be specified to operate over wide input voltage variations associated with a large source impedance of the coin cell battery (e.g., 3.3 V coin cell battery with variation between 3.6 V and 1.8 V). The switching regulators may be specified to maintain high efficiency over a wide load current range (e.g., as large as 100 to 200 mA for transmission and as small as 1 to 2 μA in deep sleep mode). Furthermore, the switching regulators may be specified to reconfigure operating modes fast enough to seamlessly maintain RF performance and SOC functionality and improve efficiency.

In order to meet these design specifications, according to certain aspects of the present disclosure, the SMPS may be designed to operate according to a pulse-width modulation (PWM) mode, a pulse-frequency modulation (PFM) mode, and an ultra-low power mode (ULPM). The operating modes may share the same output stage of the SMPS (e.g., p-type metal-oxide semiconductor (PMOS) and/or n-type metal-oxide semiconductor (NMOS) power field-effect transistors (FETs) of a buck converter), in a time-shared fashion.

When the WLAN IC is switching from receiver mode to transmitter mode with a large output power (Pout) from a power amplifier (PA) in a transmit chain, the SMPS may be reconfigured from PFM mode to PWM mode. To accomplish this, a foot switch 212 (labeled “S1”) may be coupled between a battery capacitive element 214 (labeled “C1”) and a reference potential node (e.g., electrical ground). The switch 212 may be implemented as an NMOS transistor in some aspects. The switch 212 may be closed in receiver mode to slowly charge the capacitive element 214 with power from the coin cell battery 202. During transmitter mode, the current consumed by the PMU 200 for the operation of the PA to amplify signals for transmission may be provided from the battery 202 and from the battery capacitive element 214. The total current consumed for the transmit mode is taken from the battery 202 during a longer time window, reducing the supply voltage drop due to the battery source impedance. When entering sleep mode, the foot switch 212 may be open to avoid (or at least reduce) leakage current associated with the capacitive element 214.

In some aspects, the PMU 200 (e.g., PMU integrated circuit (IC)) may include a port 240 for coupling to the battery 202 and a first terminal of the capacitive element 214. The PMU 200 may also include a port 250 for coupling to a second terminal of the capacitive element 214. SMPS1 may have an input coupled to the port 240. The switch 212 may be coupled between the port 250 and the reference potential node for the PMU 200.

Figure 3:
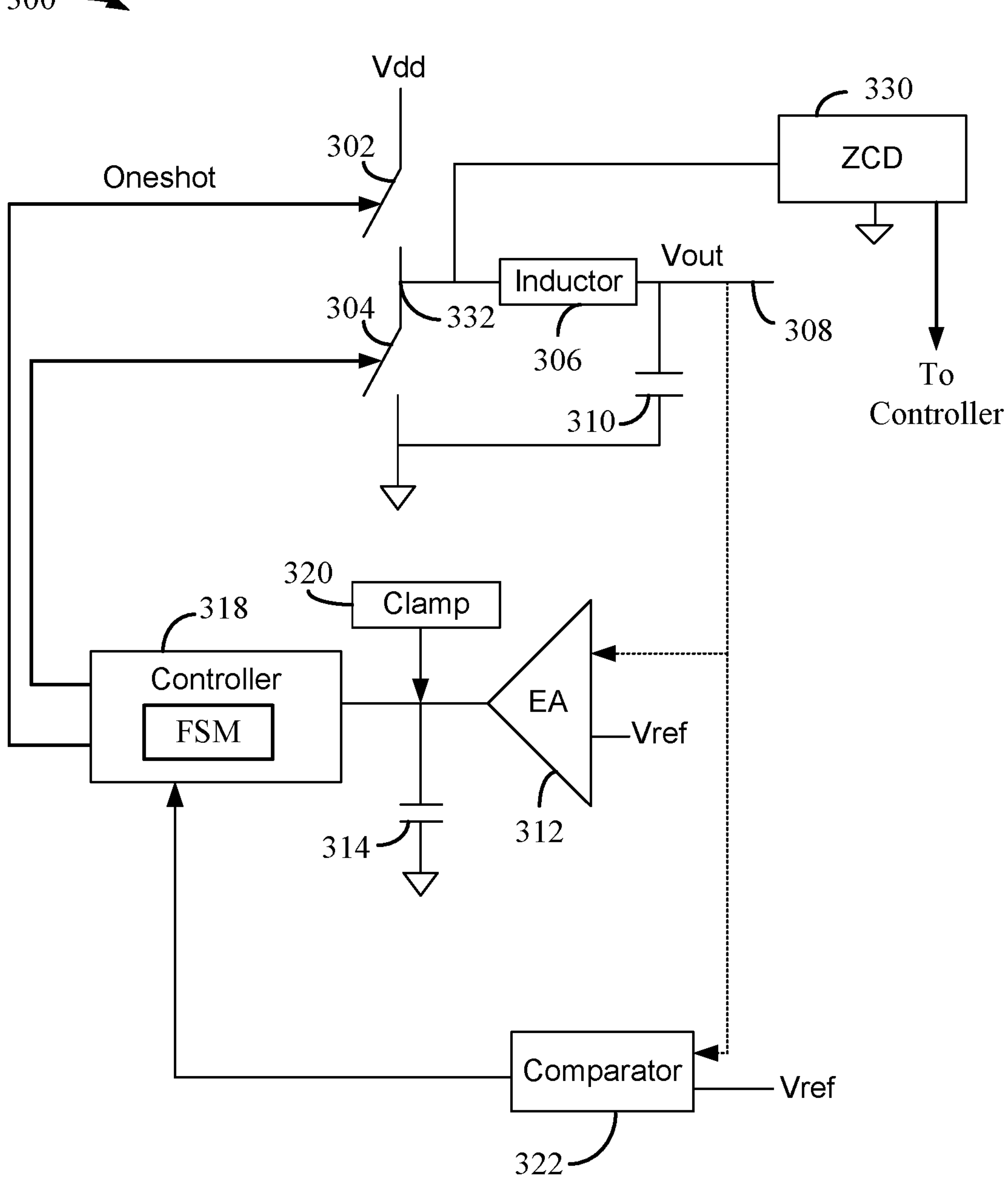
FIG. 3 illustrates an example switched-mode power supply (SMPS), in accordance with certain aspects of the present disclosure.

FIG. 3 illustrates an example SMPS 300, in accordance with certain aspects of the present disclosure. As shown, the SMPS 300 may include an output stage having a high-side switch 302 (e.g., a PMOS FET) and low-side switch 304 (e.g., an NMOS FET). During a charge phase, the high-side switch 302 may be closed, coupling the inductive element between the voltage rail (Vdd) and the output node 308 providing an output voltage Vout. During the charge phase, the current is provided from the voltage rail to the inductive element 306, increasing the inductor current. During a discharge phase, the switch 302 may be open, and the switch 304 may be closed, coupling the inductive element 306 between the reference potential node (e.g., electrical ground) and the output node 308, decreasing inductor current. In some cases, after the charging and discharging phases, the output stage may enter a tristate phase during which both switches 302, 304 are open, as described in more detail herein.

A capacitive element 310 may be coupled between the output node 308 and the reference potential node. The output voltage Vout may be provided to an input of an error amplifier 312 (labeled "EA"). Another input of the error amplifier 312 may receive a reference voltage (Vref). During PWM mode, the error amplifier 312 may be enabled and compares Vout to Vref to generate an error voltage provided to a controller 318. Based on the error voltage, the controller 318 generates switching signals (e.g., PWM signals) to control switches 302, 304 and regulate Vout.

During PFM mode, the error amplifier may be disabled. A comparator 322 may be enabled during PFM mode. The comparator 322 may receive and compare Vout and Vref to generate a comparison signal, based on which the controller 318 may control switches 302, 304 via PFM signals to regulate Vout. The comparator 322 consumes less power than the error amplifier 312, reducing the power consumption of the PMU during PFM mode as compared to PWM mode.

In some aspects of the present disclosure, the controller for the SMPS may receive a transmit enable signal from a physical (PHY) layer in advance of (e.g., a few μs before) actual transmission, allowing the SMPS to begin to reconfigure from PFM mode to PWM mode. In PFM mode, a low-power clamping circuit 320 may be enabled. The clamping circuit 320 may be coupled to the output of the error amplifier 312. A capacitive element 314 (e.g., a compensation capacitor) may be coupled between the output of the error amplifier 312 and the reference potential node. For the PWM mode to begin, the voltage at the output of the error amplifier 312 may have to reach a voltage threshold (e.g., 1 volt) after being enabled, which may cause a delay in initiating PWM mode and signal transmission. In some aspects of the present disclosure, the clamping circuit 320 may charge (e.g., precharge) the capacitive element 314 during the PFM mode before switching to PWM mode in response to receiving the transmit enable signal from the PHY layer. Thus, once the PWM mode begins, the voltage at the output of error amplifier 312 may be already at the voltage threshold to begin the PWM mode of operation. Therefore, idle time in the SMPS associated with transitioning from PFM mode to PWM mode may be reduced, allowing the PA to start sooner for signal transmission.

Figure 4:
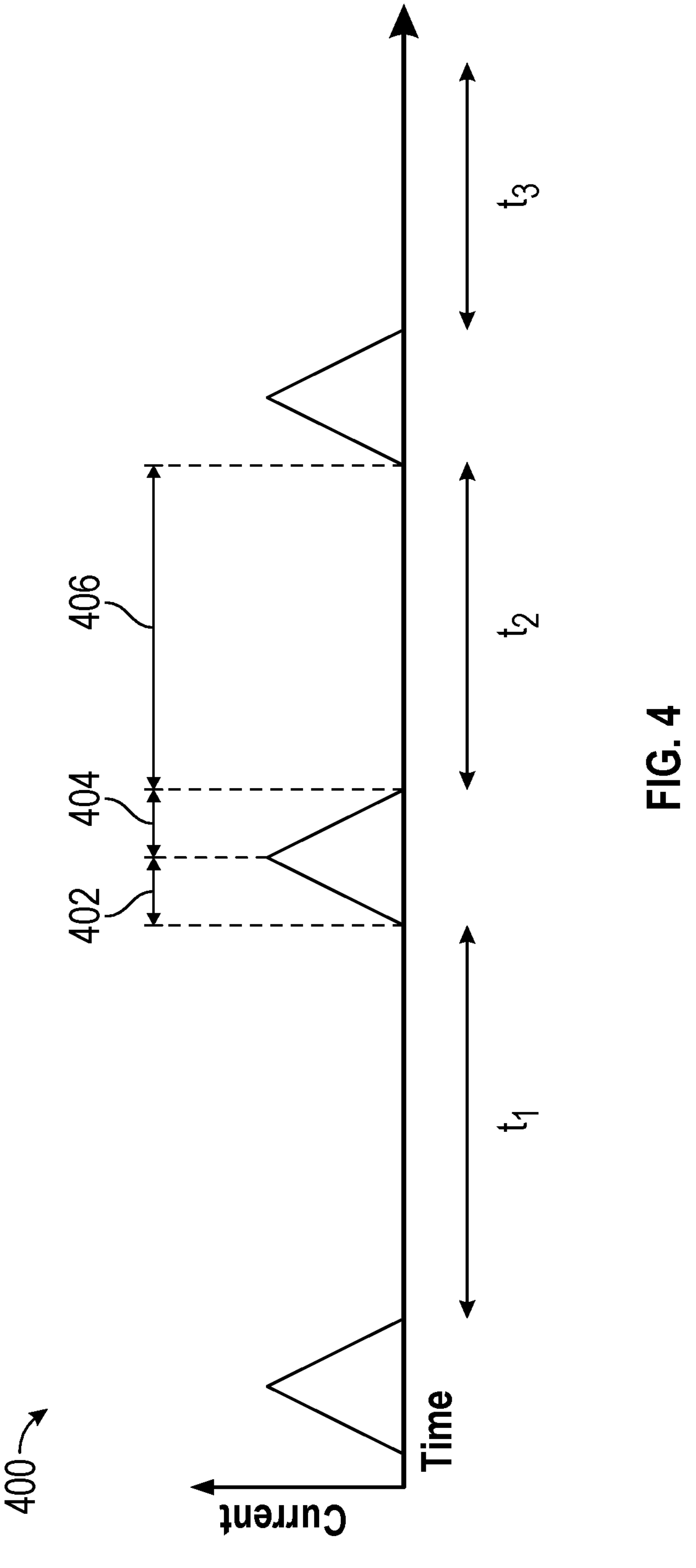
FIG. 4 is a timing diagram illustrating inductor current for an SMPS, in accordance with certain aspects of the present disclosure.

FIG. 4 is a timing diagram 400 illustrating inductor current (e.g., current across inductive element 306) for an SMPS, in accordance with certain aspects of the present disclosure. As shown, during a high-side (HS) phase (e.g., when the HS switch 302 is closed), the inductor current increases, and during a low-side (LS) phase (e.g., when the LS switch 304 is closed), the inductor current decreases. After the HS phase and LS phase, a tristate phase 406 may occur, during which both switches 302, 304 are open.

Certain aspects of the present disclosure provide techniques for automatic switching between PFM and PWM modes based on a duration of the tristate phase. When the SMPS experiences a relatively mild load current change in a functional mode (e.g., due to a temperature change or during low PA output power scenarios), an automatic switching finite state machine (FSM) may be enabled (e.g., in controller 318). In this manner, automatic PWM mode to PFM mode (or vice versa) reconfiguration may occur. When enabled, the self-contained FSM may digitize the duration during which the SMPS output stage remains in the tristate phase. In other words, the FSM may include a time-to-digital converter (TDC) that may output a digital signal indicating the duration of the tristate phase (e.g., may output the durations t1, t2, t3, and so on as shown in FIG. 4. The digital output may indicate how active the SMPS voltage is and may be used to gauge the amount of load current of the SMPS. For instance, decreasing the duration of the tristate phase may indicate an increase in load current and vice versa. The digital output indicating the tristate phase duration may be compared against programmable thresholds with hysteresis. Then, based on the comparison to the programmable thresholds, the SMPS may determine to switch to PFM mode (when in PWM mode) or to PWM mode (when in PFM mode). For instance, when the digital output drops below a first threshold, the SMPS may switch to operating in PWM mode from PFM mode. When the digital output increases above a second threshold, the SMPS may switch to operating in PFM mode from PWM mode. The first threshold may be less than the second threshold for hysteresis.

In some aspects of the present disclosure, when an electronic device (e.g., a WLAN IC) including the SMPS enters sleep mode, the SMPS may be reconfigured to enter the ULPM. During the ULPM, a synchronizing clock may be driven from a sleep clock source (e.g., oscillator 208 described with respect to FIG. 2) that is used for the SOC to maintain sleep mode. An internal node of the sleep clock source, which may operate at a multiple of (e.g., twice) the frequency of the sleep clock, may be tapped to increase load current handling capability (e.g., for a high-temperature scenario). Except for a low-power comparator, the mixed-signal FSM of the controller works in an event-driven fashion to reduce the controller's current consumption, as described in more detail herein. When this comparator detects a lowered regulated output (e.g., a lowered Vout of the SMPS), the comparator may trigger a programmable short pulse (e.g., referred to herein as a one-shot pulse or activation pulse) to enable the SMPS output stage. Then, the comparator output may be auto-reset after a delay to continue to monitor the regulated output. The time difference between adjacent short pulses may be regulated by the sleep clock (e.g., using a fail-safe controller) to facilitate controller functionality in large load conditions.

Figure 5:
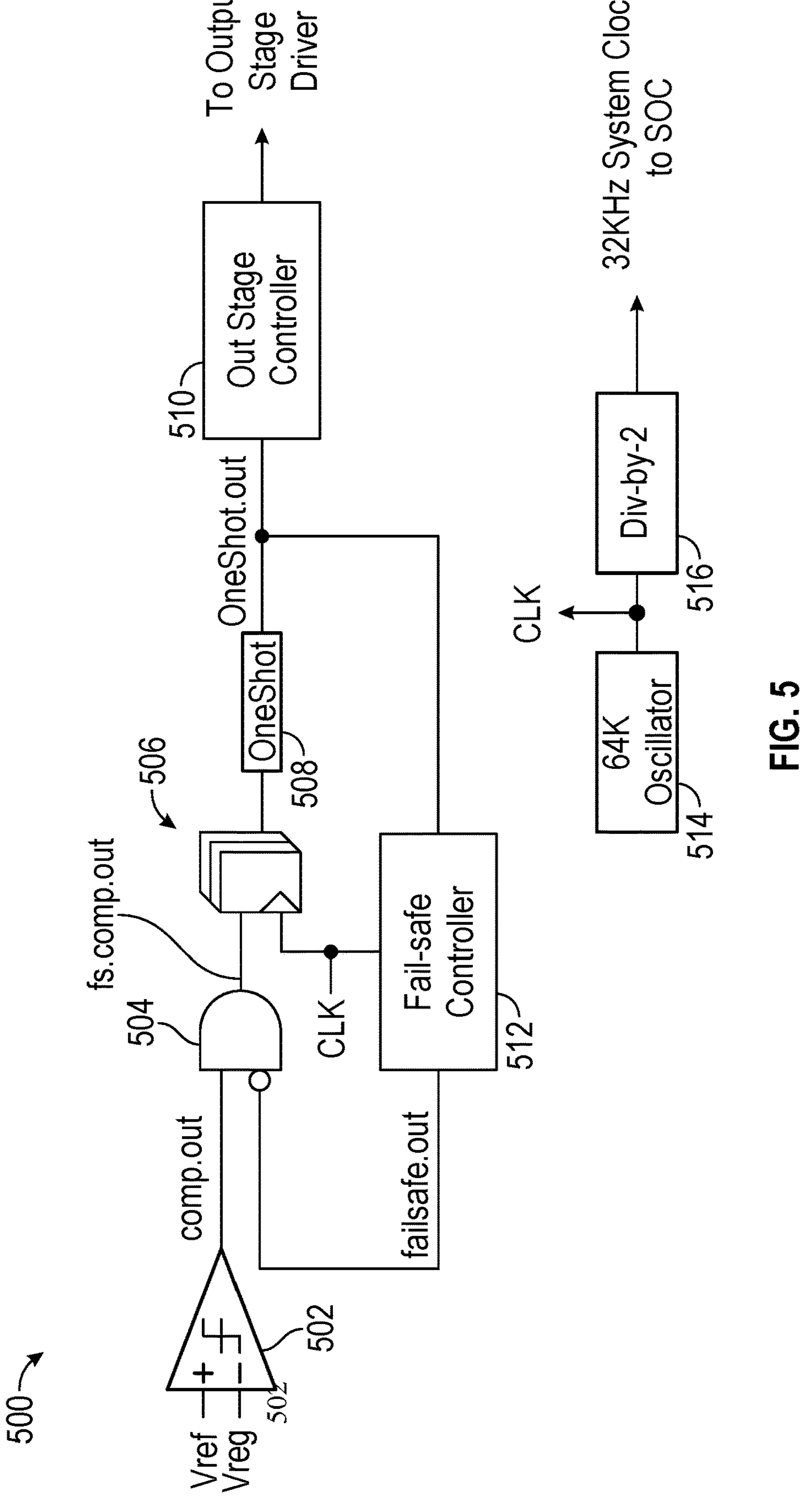
FIG. 5 is a block diagram of example components for an ultra-low power mode (ULPM) in a SMPS, in accordance with certain aspects of the present disclosure.
Figure 6:
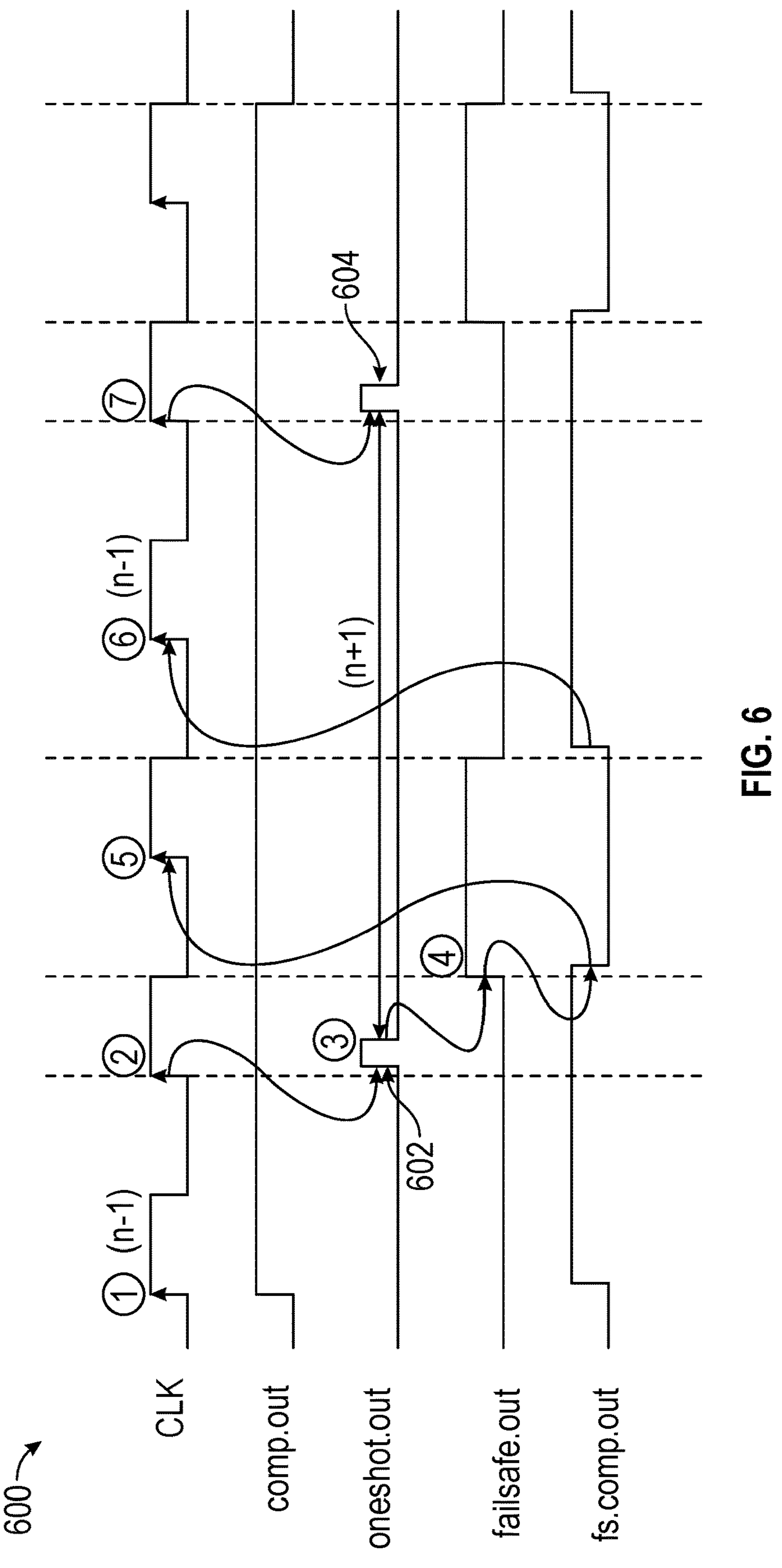
FIG. 6 is a timing diagram illustrating signals of a ULPM controller, in accordance with certain aspects of the present disclosure.

FIG. 5 illustrates example components of a ULPM controller 500, in accordance with certain aspects of the present disclosure. FIG. 6 is a timing diagram 600 illustrating signals of the ULPM controller 500, in accordance with certain aspects of the present disclosure. As shown, the ULPM controller 500 may operate using a synchronizing clock (labeled "CLK") which may be generated by an oscillator 514 (e.g., a 64 kHz oscillator, which may be an on-chip oscillator). The oscillator 514 may correspond to the oscillator 208 described with respect to FIG. 2. The oscillator 514 may also be used as the SOC system clock after being frequency divided using a frequency divider 516 (e.g., a divide-by-2 frequency divider, labeled "Div-by-2"). The ULPM controller 500 controls the same SMPS output stage that is used during the PWM and PFM modes in a time-sharing manner.

As shown, the ULPM controller 500 may include a comparator 502 which may receive a regulated output voltage (Vreg) and a reference voltage (Vref). Vreg may correspond to Vout at output node 308, described with respect to FIG. 3. The comparator 502 compares Vreg and Vref and generates a comparator output signal (e.g., labeled "comp.out"). The comparator 502 may be the only circuit of the ULPM controller 500 that is always on. All the other circuits may be enabled only when being used by the ULPM controller. While Vreg is greater than Vref, the comparator output signal (comp.out) is logic low. As shown, the output of the comparator 502 is provided to an input of an AND gate 504. Thus, with the comparator output signal (comp.out) being logic low, the output signal of the AND gate is logic low, resulting in a one-shot output signal (labeled "oneShot.out") at an output of a one-shot circuit 508 (e.g., also referred to herein as a "pulse generation circuit") being logic low. The one-shot output signal is provided to the SMPS output stage controller 510 (e.g., corresponding to controller 318 of FIG. 3), resulting in the SMPS being in idle mode (e.g., tristate mode) since the one-shot output signal is logic low. While the comparator output signal is logic low, other than comparator 502, the ULPM controller 500 may not consume any power.

When Vreg becomes lower than Vref, the comparator output signal transitions to logic high. The transition of the comparator output signal may be captured using the clock signal. For example, the comparator output signal may be provided to an input of the AND gate 504, where another input of the AND gate 504 is configured to receive an inverse of a fail-safe output signal (labeled "failsafe.out"). As shown in timing diagram 600, the fail-safe output signal is logic low when the comparator output signal initially transitions to logic high. Thus, the comparator output signal transitions to logic high, resulting in the output signal of the AND gate 504 (e.g., referred to as failsafe comparator output signal, labeled "fs.comp.out") also transitioning to logic high.

As shown, n flip-flops 506 may be coupled to the output of the AND gate 504, n being any positive integer. The n flip-flops may be chained together with the output of one flip-flop coupled to an input of a next flip-flop. The clock signal may be provided to the clock inputs of the n flip-flops 506.

As shown in timing diagram 600, at time 1, a first one of the n flip-flops 506 samples the comparator output signal as logic high. The sampled logic high propagates from one flip-flop to another (of the n flip-flops) until the last one of the flip-flops generates a logic high signal (e.g., after n−1 clock cycles) at time 2. The logic high signal at the output of the last one of the flip-flops is provided to the one-shot circuit 508. At time 3, the one-shot circuit 508 generates a one-shot pulse 602 (labeled "oneShot.out") at the input of the output stage controller 510, as shown. The one-shot pulse 602 is used to drive the HS switch 302 shown in FIG. 3. Thus, while the one-shot pulse 602 is logic high, the HS switch 302 is closed, resulting in the HS phase (e.g., HS phase 402 shown in FIG. 4).

The one-shot pulse 602 briefly enables the SMPS output stage and a zero-crossing detector for the SMPS. For instance, as shown in FIG. 3, a zero-crossing detector 330 may be coupled to a switching node 332 of the SMPS. After the rising edge of the one-shot pulse 602, the HS switch 302 is closed, and the voltage at the switching node 332 increases. At the falling edge of the one-shot pulse 602, the HS switch 302 is opened, and the LS switch 304 is closed (e.g., resulting in LS phase 404 shown in FIG. 4), decreasing the voltage at the switching node 332. The zero-crossing detector 330 detects when the voltage at the switching node 332 reaches zero volts and sends an indication to controller 318, and the controller opens switch 304. Using the zero-crossing detector 330, the output stage of the SMPS is returned back to tristate without wasting SMPS inductor energy since the transition to tristate occurs when the voltage at the switching node 332 is zero.

After the one-shot pulse 602 is generated, the regulated voltage Vreg may increase above Vref, resulting in the comparator output signal (comp.out) transitioning to logic low. However, if Vreg remains below Vref, the comparator output signal may remain logic high as shown in timing diagram 600. As shown in FIG. 6, at time 4, the fail-safe controller 512 detects the one-shot pulse 602. As shown, the fail-safe controller 512 may generate a delayed and extended pulse (e.g., failsafe.out) of one clock cycle pulse-width at the next falling clock edge following the one-shot pulse 602. At time 5, the first one of the n flip-flops samples a logic low due to the fail-safe logic despite the comparator output signal being logic high. In other words, even though the comparator output signal is logic high, the output of the AND gate 504 (e.g., fs.comp.out) is logic low because the failsafe.out signal that is logic high is provided to the inverting input of the AND gate 504. At time 6, the first one of the n flip-flops samples a logic high at the next rising edge of the clock signal creating a low-to-high transition used by the one-shot circuit 508 to output another one-shot pulse 604 at time 7. The process may be repeated until the Vreg increases above Vref.

Certain aspects of the present disclosure are directed towards creating consecutive one-shot pulses with increasing pulse durations to increase Vreg above Vref. For example, the one-shot circuit 508 may be configured to generate the one-shot pulse 604 with a longer pulse duration than one-shot pulse 602 based on a duration of a tristate phase.

Figure 7:
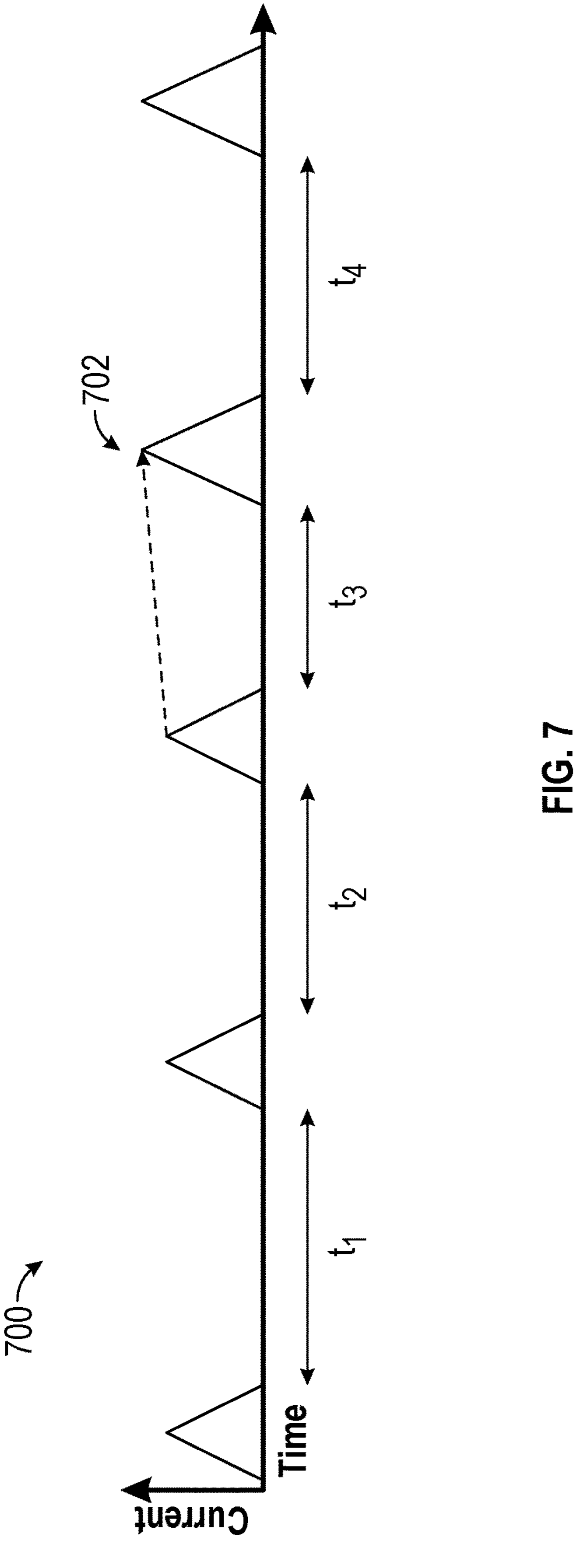
FIG. 7 is a timing diagram illustrating inductor current for an SMPS in response to activation pulses, in accordance with certain aspects of the present disclosure.

FIG. 7 is a timing diagram 700 illustrating inductor current for an SMPS in response to one-shot pulses, in accordance with certain aspects of the present disclosure. As described with respect to FIG. 4, as the SMPS load current increases, the tristate phase's time duration (e.g., time durations $t_1$, $t_2$, $t_3$, $t_4$, . . . ) may decrease. In some aspects, the time duration of the tristate phase may be counted with a system sleep clock (e.g., converted to a digital signal using a TDC). Once the digital value becomes smaller than a threshold (e.g., time duration t3 becomes less than a threshold), the one-shot pulse width may be increased, as shown. For instance, the time duration $t_3$ (or the digital signal representing duration $t_3$) may be less than a threshold, and the following one-shot pulse may have an increased pulse width as compared to the previous one-shot pulse (e.g., prior to the tristate phase having the duration $t_3$). Increased one-shot pulse width increases inductor current (e.g., increased inductor current peak 702). Due to the increased one-shot pulse width and the increased inductor current, the tristate phase may have an increased duration $t_4$.

As described, the ULPM controller 500 may output a delayed and widened pulse, creating consecutive one-shot pulses provided to the output stage controller 510 to increase Vreg above Vref. Certain aspects of the present disclosure provide a current-limiting function that balances SMPS efficiency and load current handling capability, without having a current limiter circuit. In some aspects, the fail-safe controller 512 may compare adjacent pulse inputs and may ignore the latter pulse if the latter arrives too early. If a duration between two consecutive one-shot pulses is less than a threshold, a failure may occur for the fail-safe controller 512. Thus, the fail-safe controller 512 may ignore the latter pulse if a duration from the latter pulse to a previous pulse is less than a threshold.

With the SMPS described herein, an electronic device (e.g., WLAN IC) may be powered using a coin cell battery (e.g., a CR2032). The source impedance of the coin cell battery is known to increase over time. In some aspects, the usable lifetime of the coin cell battery may be increased by limiting the peak current under PA operation. Decent dynamic error vector magnitude (EVM) can be achieved with minimum (or at least reduced) SMPS current consumption to prepare for the transition from PFM mode to the PWM mode. Hardware-based auto-switching between PWM and PFM modes may keep the SMPS in a desired efficiency state.

Figure 8:
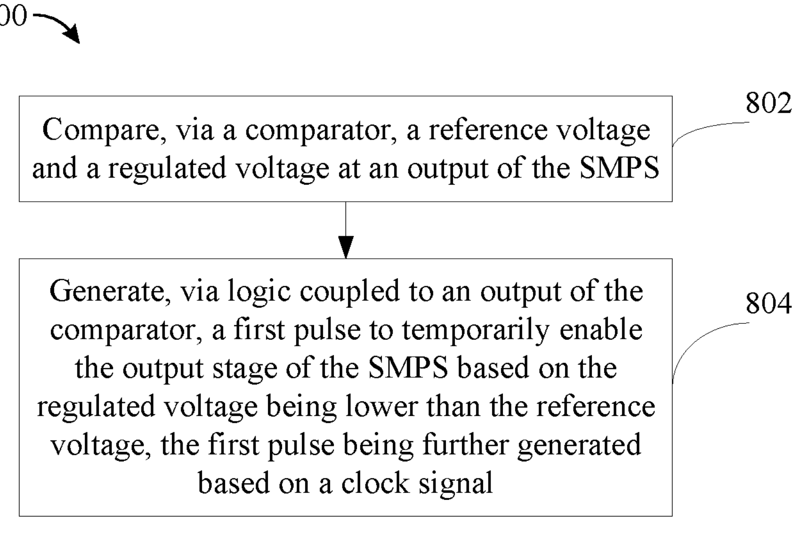
FIG. 8 is a flow diagram illustrating example operations for controlling an output stage of a SMPS, in accordance with certain aspects of the present disclosure.

FIG. 8 is a flow diagram illustrating example operations 800 for controlling an output stage of a switched-mode power supply (SMPS), in accordance with certain aspects of the present disclosure. The operations 800 may be performed, for example, by a power control circuit, such as the ULPM controller 500.

At block 802, the power control circuit compares (e.g., via comparator 502) a reference voltage (e.g., Vref) and a regulated voltage (e.g., Vreg) at an output of the SMPS. At block 804, the power control circuit generates, via logic coupled to an output of the comparator, a first pulse (e.g., one-shot pulse 602 of FIG. 6) to temporarily enable the output stage of the SMPS based on the regulated voltage being lower than the reference voltage. Enabling the output stage of the SMPS may include closing a high side (HS) switch (e.g., switch 302 of FIG. 3) of the output stage during the first pulse. The first pulse may be generated based on a clock signal. In some aspects, the first pulse may be generated based on the SMPS being in a low-power mode.

In some aspects, the power control circuit generates a second pulse (e.g., one-shot pulse 604 of FIG. 6) to temporarily enable the output stage of the SMPS based on the regulated voltage being lower than the reference voltage after generating the first pulse. In some aspects, a duration of the second pulse is greater than a duration of the first pulse. Generating the second pulse includes setting the duration of the second pulse to be greater than the duration of the first pulse based on a duration of a tristate phase of the SMPS being less than a threshold. The tristate phase may be after the first pulse is generated and before the second pulse is generated.

In some aspects, the power control circuit detects, via a controller (e.g., fail-safe controller 512), the first pulse. The power control circuit may delay the generation of the second pulse based on the detection of the first pulse. The generation of the second pulse may be delayed by a duration associated with a cycle of the clock signal.

EXAMPLE ASPECTS

Aspect 1. An integrated circuit (IC) for power management, the IC comprising: a first port for coupling to a battery and a first terminal of a capacitive element; a second port for coupling to a second terminal of the capacitive element; a switched-mode power supply (SMPS) having an input coupled to the first port; and a switch coupled between the second port and a reference potential node for the IC.

Aspect 2. The IC of Aspect 1, wherein the switch is configured to be open during a pulse-frequency modulation (PFM) mode of the SMPS.

Aspect 3. The IC of Aspect 2, wherein the switch is configured to be closed before the SMPS changes from the PFM mode to a pulse-width modulation (PWM) mode and wherein the switch is configured to remain closed after the SMPS changes to the PWM mode.

Aspect 4. The IC of Aspect 3, wherein the switch is configured to be closed 50 ms to 150 ms before the SMPS changes from the PFM mode to the PWM mode.

Aspect 5. The IC of any of Aspects 1-4, further comprising logic coupled to the SMPS, the logic being configured to: determine an amount of time an output stage of the SMPS is in a tristate mode; and automatically select between a pulse-frequency modulation (PFM) mode a pulse-width modulation (PWM) mode for the SMPS, based on the amount of time.

Aspect 6. The IC of Aspect 5, wherein in order to automatically select between the PFM mode and the PWM mode for the SMPS, the logic is configured to: select the PFM mode when the amount of time is larger than a first threshold time; and select the PWM mode when the amount of time is smaller than a second threshold time.

Aspect 7. The IC of any of Aspects 1-6, further comprising: a comparator having a first input coupled to a reference voltage node and having a second input coupled to an output of the SMPS; and logic having an input coupled to an output of the comparator and having outputs coupled to control inputs of the SMPS, wherein when the SMPS is in a low power mode and when a regulated voltage at the second input of the comparator is lower than a reference voltage at the first input of the comparator, the logic is configured to trigger a pulse to temporarily enable an output stage of the SMPS.

Aspect 8. The IC of Aspect 7, wherein the SMPS is in the low power mode and when the regulated voltage is higher than the reference voltage, the logic is configured to keep the SMPS idle.

Aspect 9. The IC of any of Aspects 7-8, wherein when the SMPS is in the low power mode and when the regulated voltage is higher than the reference voltage, the comparator is configured to draw current, but the logic is disabled.

Aspect 10. A wireless local area network (WLAN) device comprising the IC of Aspect 1, further comprising: the battery having a first terminal coupled to the first port and having a second terminal coupled to the reference potential node for the IC; and the capacitive element coupled between the first port and the second port of the IC.

Aspect 11. The WLAN device of Aspect 10, wherein the battery is a coin cell battery.

Aspect 12. The WLAN device of Aspect 11, wherein the coin cell battery is a CR2032 battery.

Aspect 13. A method of using, operating, or forming an IC or a device according to any of Aspects 1-12.

Aspect 14: An integrated circuit (IC) for power management, the IC comprising: a first port for coupling to a battery and a first terminal of a capacitive element; a second port for coupling to a second terminal of the capacitive element; a switched-mode power supply (SMPS) having an input coupled to the first port; and a switch coupled between the second port and a reference potential node for the IC.

Aspect 15: The IC of Aspect 14, wherein the switch is configured to be open during a pulse-frequency modulation (PFM) mode of the SMPS.

Aspect 16: The IC of Aspect 15 or 2, wherein the switch is configured to be closed before the SMPS changes from the PFM mode to a pulse-width modulation (PWM) mode and wherein the switch is configured to remain closed after the SMPS changes to the PWM mode.

Aspect 17: The IC according to any of Aspects 16-16, wherein the switch is configured to be closed 50 ms to 150 ms before the SMPS changes from the PFM mode to the PWM mode.

Aspect 18: The IC according to any of Aspects 14-17, further comprising logic coupled to the SMPS, the logic being configured to: determine an amount of time an output stage of the SMPS is in a tristate mode; and automatically select between a pulse-frequency modulation (PFM) mode and a pulse-width modulation (PWM) mode for the SMPS, based on the amount of time.

Aspect 19: The IC according to any of Aspects 18-18, wherein in order to automatically select between the PFM mode and the PWM mode for the SMPS, the logic is configured to: select the PFM mode based on the amount of time being larger than a first threshold time; and select the PWM mode based on the amount of time being smaller than a second threshold time.

Aspect 20: The IC according to any of Aspects 14-19, further comprising: a comparator having a first input coupled to a reference voltage node and having a second input coupled to an output of the SMPS; and logic having an input coupled to an output of the comparator and having outputs coupled to control inputs of the SMPS, wherein when the SMPS is in a low power mode and when a regulated voltage at the second input of the comparator is lower than a reference voltage at the first input of the comparator, the logic is configured to trigger a pulse to temporarily enable an output stage of the SMPS.

Aspect 21: The IC according to any of Aspects 20-20, wherein when the SMPS is in the low power mode and when the regulated voltage is higher than the reference voltage, the logic is configured to keep the SMPS idle.

Aspect 22: The IC according to any of Aspects 20-21, wherein when the SMPS is in the low power mode and when the regulated voltage is higher than the reference voltage, the comparator is configured to draw current, but the logic is disabled.

Aspect 23: A wireless local area network (WLAN) device comprising the IC according to any of Aspects 14-22, further comprising: the battery having a first terminal coupled to the first port and having a second terminal coupled to the reference potential node for the IC; and the capacitive element coupled between the first port and the second port of the IC.

Aspect 24: The WLAN device according to any of Aspects 23-23, wherein the battery is a coin cell battery.

Aspect 25: A circuit for controlling an output stage of a switched-mode power supply (SMPS), comprising: a comparator having a first input coupled to a reference voltage node and having a second input coupled to an output of the SMPS; and logic having an input coupled to an output of the comparator and having an output coupled to a control input of the SMPS, wherein the logic is configured to generate a first pulse to temporarily enable the output stage of the SMPS based on a regulated voltage at the second input of the comparator being lower than a reference voltage at the first input of the comparator, the first pulse being further generated based on a clock signal.

Aspect 26: The circuit according to any of Aspects 25-25, wherein the logic is configured to generate the first pulse based on the SMPS being in a low power mode.

Aspect 27: The circuit according to any of Aspects 25-26, wherein the logic is further configured to generate a second pulse to temporarily enable the output stage of the SMPS based on the regulated voltage at the second input of the comparator being lower than the reference voltage at the first input of the comparator after generating the first pulse.

Aspect 28: The circuit according to any of Aspects 27-27, wherein a duration of the second pulse is greater than a duration of the first pulse.

Aspect 29: The circuit according to any of Aspects 28-28, wherein the logic is configured to set the duration of the second pulse to be greater than the duration of the first pulse based on a duration of a tristate phase of the SMPS being less than a threshold, the tristate phase being after the first pulse is generated and before the second pulse is generated.

Aspect 30: The circuit according to any of Aspects 25-29, wherein the logic comprises: one or more flip-flops coupled to an output of the comparator and having a clock input configured to receive the clock signal; and a pulse generation circuit coupled to the one or more flip-flops and configured to generate the first pulse to enable the output stage of the SMPS.

Aspect 31: The circuit according to any of Aspects 30-30, further comprising: an AND gate having a first input coupled to the output of the comparator and an output coupled to the one or more flip-flops; and a controller having an input coupled to an output of the pulse generation circuit and an output coupled to a second input of the AND gate.

Aspect 32: The circuit according to any of Aspects 31-31, wherein the controller is configured to provide a second pulse to the second input of the AND gate based on the first pulse.

Aspect 33: The circuit according to any of Aspects 32-32, wherein: a clock input of the controller is configured to receive the clock signal; and a duration of the second pulse is associated with a cycle of the clock signal.

Aspect 34: The circuit according to any of Aspects 33-33, wherein the second input of the AND gate comprises an inverting input, and wherein the second pulse is logic high during the cycle of the clock signal.

Aspect 35: The circuit according to any of Aspects 25-34, wherein enabling the output stage of the SMPS comprises closing a high side (HS) switch of the output stage during the first pulse.

Aspect 36: A method for controlling an output stage of a switched-mode power supply (SMPS), comprising: comparing, via a comparator, a reference voltage and a regulated voltage at an output of the SMPS; and generating, via logic coupled to an output of the comparator, a first pulse to temporarily enable the output stage of the SMPS based on the regulated voltage being lower than the reference voltage, the first pulse being further generated based on a clock signal.

Aspect 37: The method according to any of Aspects 36-36, wherein the first pulse is generated based on the SMPS being in a low power mode.

Aspect 38: The method according to any of Aspects 36-37, further comprising generating a second pulse to temporarily enable the output stage of the SMPS based on the regulated voltage being lower than the reference voltage after generating the first pulse.

Aspect 39: The method according to any of Aspects 38-38, wherein a duration of the second pulse is greater than a duration of the first pulse.

Aspect 40: The method according to any of Aspects 39-39, wherein generating the second pulse includes setting the duration of the second pulse to be greater than the duration of the first pulse based on a duration of a tristate phase of the SMPS being less than a threshold, the tristate phase being after the first pulse is generated and before the second pulse is generated.

Aspect 41: The method according to any of Aspects 38-40, further comprising: detecting, via a controller, the first pulse; and delaying the generation of the second pulse based on the detection of the first pulse.

Aspect 42: The method according to any of Aspects 41-41, wherein the generation of the second pulse is delayed by a duration associated with a cycle of the clock signal.

Aspect 43: The method according to any of Aspects 36-42, wherein enabling the output stage of the SMPS comprises closing a high side (HS) switch of the output stage during the first pulse.

Additional Considerations

The various operations of methods described above may be performed by any suitable means capable of performing the corresponding functions. The means may include various hardware and/or software component(s) and/or module(s), including, but not limited to a circuit, an application-specific integrated circuit (ASIC), or a processor. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes, and variations may be made in the arrangement, operation, and details of the methods and apparatus described above without departing from the scope of the claims.

What is claimed is:

1. An integrated circuit (IC) for power management, the IC comprising:

a first port for coupling to a battery and a first terminal of a capacitive element;

a second port for coupling to a second terminal of the capacitive element;

a switched-mode power supply (SMPS) having an input coupled to the first port; and a switch coupled between the second port and a reference potential node for the IC.

2. The IC of claim 1, wherein the switch is configured to be open during a pulse-frequency modulation (PFM) mode of the SMPS.

3. The IC of claim 2, wherein the switch is configured to be closed before the SMPS changes from the PFM mode to a pulse-width modulation (PWM) mode and wherein the switch is configured to remain closed after the SMPS changes to the PWM mode.

4. The IC of claim 3, wherein the switch is configured to be closed 50 ms to 150 ms before the SMPS changes from the PFM mode to the PWM mode.

5. The IC of claim 1, further comprising logic coupled to the SMPS, the logic being configured to:

determine an amount of time an output stage of the SMPS is in a tristate mode; and automatically select between a pulse-frequency modulation (PFM) mode and a pulse-width modulation (PWM) mode for the SMPS, based on the amount of time.

6. The IC of claim 5, wherein in order to automatically select between the PFM mode and the PWM mode for the SMPS, the logic is configured to:

select the PFM mode based on the amount of time being larger than a first threshold time; and select the PWM mode based on the amount of time being smaller than a second threshold time.

7. The IC of claim 1, further comprising:

a comparator having a first input coupled to a reference voltage node and having a second input coupled to an output of the SMPS; and logic having an input coupled to an output of the comparator and having outputs coupled to control inputs of the SMPS, wherein when the SMPS is in a low power mode and when a regulated voltage at the second input of the comparator is lower than a reference voltage at the first input of the comparator, the logic is configured to trigger a pulse to temporarily enable an output stage of the SMPS.

8. The IC of claim 7, wherein when the SMPS is in the low power mode and when the regulated voltage is higher than the reference voltage, the logic is configured to keep the SMPS idle.

9. The IC of claim 7, wherein when the SMPS is in the low power mode and when the regulated voltage is higher than the reference voltage, the comparator is configured to draw current, but the logic is disabled.

10. A wireless local area network (WLAN) device comprising the IC of claim 1, further comprising:

the battery having a first terminal coupled to the first port and having a second terminal coupled to the reference potential node for the IC; and the capacitive element coupled between the first port and the second port of the IC.

11. The WLAN device of claim 10, wherein the battery is a coin cell battery.

* * * * *